United States Patent [19]
McCall et al.

[11] Patent Number: 5,546,040
[45] Date of Patent: Aug. 13, 1996

[54] POWER EFFICIENT TRANSISTOR AND METHOD THEREFOR

[75] Inventors: Scott D. McCall, Gilbert; Gary W. Hoshizaki, Mesa, both of Ariz.

[73] Assignee: Motorola, Inc., Schaumburg, Ill.

[21] Appl. No.: 7,230

[22] Filed: Jan. 22, 1993

[51] Int. Cl.$^6$ ............................. H03K 5/153; H03K 5/22
[52] U.S. Cl. ............................. 327/479; 327/530; 327/80; 327/432
[58] Field of Search ................................. 307/299.1, 251, 307/296.1, 363, 570

[56] References Cited

U.S. PATENT DOCUMENTS

| | | | |
|---|---|---|---|
| 3,863,169 | 1/1975 | Knight | 307/299.1 |
| 4,672,235 | 6/1987 | Villa et al. | 307/299.1 |

*Primary Examiner*—Margaret Rose Wambach
*Attorney, Agent, or Firm*—Michael D. Bingham; Gary W. Hoshizaki

[57] ABSTRACT

A power efficient transistor (11) which operates in or near saturation having a base (16), a collector (17), and an emitter (18). A first transistor (12) having a base, collector, and emitter coupled to the base (16), collector (17), and emitter (18) of the transistor (11). The first transistor (12) is biased to operate in or near saturation under quiescent conditions. A plurality of transistors (13) are incrementally enabled or disabled to maintain the transistor (11) in or near saturation under all operating conditions. Each of the transistors (13) have a base, collector, and emitter coupled to the base (16), collector (17), and emitter (18) of the transistor (11). A plurality of drive transistors (14), enable or disable a corresponding one of each transistor of the transistors (13). Each drive transistor of the drive transistors (14) is enabled at a different voltage thereby incrementally enabling and disabling each transistor of transistors (13) maintaining transistor 11 in or near saturation.

17 Claims, 2 Drawing Sheets

POWER EFFICIENT TRANSISTOR AND METHOD THEREFOR

BACKGROUND OF THE INVENTION

This invention relates, in general, to transistors, and more particularly to power transistors.

A problem associated with power transistors in a discrete or an integrated circuit application is that the power transistors are generally not operated in a power efficient manner. It is well known by those skilled in the art that a transistor operates at maximum power efficiency when biased in or near saturation.

For example, an integrated circuit having an amplifier uses power transistors in the amplifier output stage. Generally, there is little or no latitude for choosing power transistors, the power transistors are chosen for the maximum power requirement of the amplifier application. The power transistors rarely, if at all, operate near maximum power. In other words, the power transistors are not biased in or near saturation under normal conditions which is power inefficient.

It would be of great benefit if a power transistor could be developed which meets the maximum power requirement of an application yet can be operated in or near saturation under general operating conditions.

SUMMARY OF THE INVENTION

Briefly stated, this invention provides a power efficient transistor and method therefore. The power efficient transistor having a base, a collector, and an emitter. The power efficient transistor comprises a first transistor having a base, a collector, and an emitter coupled to the base, the collector, and the emitter of the power efficient transistor, respectively, a plurality of transistors, each transistor having a collector and an emitter coupled to the collector and the emitter of the power efficient transistor, respectively, and an enabling means for enabling or disabling the plurality of transistors. The enabling means enables or disables transistors of the plurality of transistors such that the power efficient transistor operates at or near saturation.

DETAILED DESCRIPTION OF THE DRAWINGS

Figure 1:
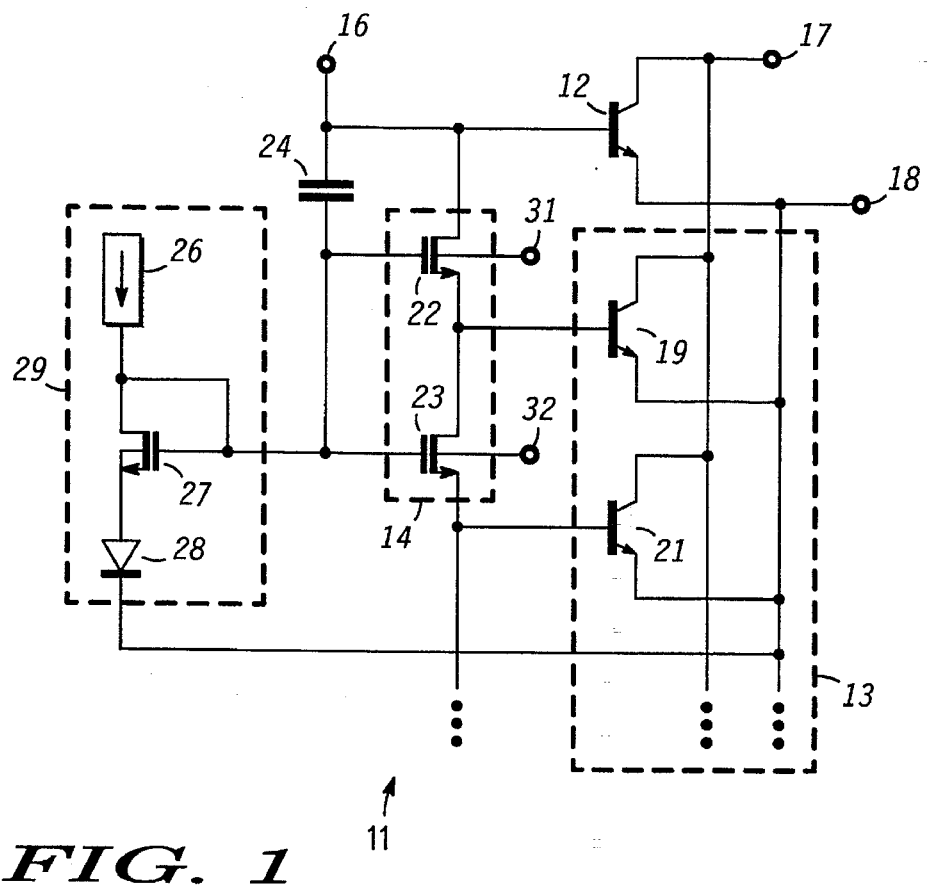
FIG. 1 is a schematic of a power efficient transistor in accordance with the present invention.

FIG. 1 is a schematic of a npn power efficient transistor 11 in accordance with the present invention. It should obvious to those skilled in the art that an analogous pnp version of the pnp power efficient transistor could also be formed. Transistors in general, and more particularly power transistors do not operate in a mode that optimizes power efficiency. This is mainly due to design constraints which force the use of transistors which reliably can meet maximum power requirements. Although designed for these high power levels the transistors rarely operate at these maximum power levels. It is extremely inefficient to operate a transistor designed for high power output at low levels. A transistor must operate at or near saturation to maximize power efficiency. Npn transistor 11 can meet maximum power requirements yet operate at or near saturation to maximize power efficiency. Npn transistor 11 can be formed as an integrated device (all elements which comprise transistor 11 formed on the same semiconductor wafer).

Npn transistor 11 has a base 16, a collector 17, and an emitter 18. Npn transistor 11 further comprises transistor 12, a plurality of transistors 13, and a plurality of driver transistors 14. Transistor 12 has a base, a collector, and an emitter, coupled to base 16, collector 17, and emitter 18, respectively of transistor 11. Transistor 12 is a directly coupled transistor element for transistor 11 and is always enabled when transistor 11 is enabled. In the preferred embodiment, the geometry or device size of transistor 12 is chosen to maximize power efficiency under quiescent operating conditions.

For illustration purposes, plurality of transistors 13 comprise a transistor 19 and a transistor 21 although more transistors are typically used in forming transistor 11. The number of transistors used in plurality of transistors 13 is a function of power, operating requirements, efficiency, processing, and device area. Increasing the number of transistors 13 provides added refinement in maintaining transistor 11 in or near saturation. Transistors 19 and 21 have a collector and an emitter coupled to collector 17 and emitter 18, respectively, of transistor 11. In the preferred embodiment, transistors 19 and 21, which comprise transistors 13, are equal in size.

Plurality of drive transistors 14 enable or disable plurality of transistors 13. Plurality of drive transistors 14 serve as an enabling means. In the preferred embodiment, drive transistors 14 are n-channel metallic oxide semiconductor field effect transistors (MOSFETs) and are serially coupled. Other types of transistors could be used as drive transistors 14. A drive transistor 22 and a drive transistor 23 comprises drive transistors 14. If more transistors 13 are added to transistor 11 a corresponding number of drive transistors must also be added. Drive transistor 22 is the first transistor of the serially coupled transistors 14. Drive transistor 22 is shown as having a gate, a drain coupled to base 16, and a source coupled the base of transistor 19. Drive transistor 22 enables or disables corresponding transistor 19. Drive transistor is shown as 23 having a gate, a drain coupled to the source of transistor 22, and a source coupled to the base of transistor 21 is coupled serially to transistor 22. Drive transistor 23 enables or disables corresponding transistor 21. Each individual transistor (22, 23) of drive transistors 14 is coupled between base 16 of transistor 11 and the base of a corresponding transistor of transistors 13. Any other drive transistors added to drive transistors 14 are coupled serially to a preceding drive transistor. In the preferred embodiment, the gates of transistors 22 and 23 are capacitively coupled to base 16 through a capacitor 24. Capacitively coupling the gates of drive transistors 14 to the base of transistor 11 disables transistors 19 and 21 under quiescent or static conditions.

Transistor 11 is formed such that drive transistors 14 are incrementally enabled or disabled corresponding to a transient voltage at base 16. Enabled transistor 12 and any transistors 13 enabled by transistors 14 operate in or near saturation for maximum power efficiency. One method for accomplishing the incremental enabling and disabling of drive transistors 14 is to set each drive transistor 14 to a different predetermined threshold voltage. For example, transistor 22 is set at a first predetermined threshold voltage. Transistor 23 is set at a second predetermined threshold voltage incrementally higher than the threshold voltage of transistor 22. If additional drive transistors 14 were added each would have a predetermined threshold voltage incrementally higher than the preceding drive transistor, thus each transistor 14 has a different threshold voltage. Each gate of each transistor 14 receives the same voltage potential, thus only those transistors of transistors 14 having a gate to source voltage exceeding their predetermined threshold voltage are enabled.

A secondary factor in choosing device geometry's of each individual transistor comprising transistors 14 is the channel resistance of each transistor. Voltage drops in series coupled transistors 14 are additive which increases the voltage needed to enable each transistor after transistor 22 of transistors 14. The channel resistance should be made as small as possible to minimize the voltage drop from drain to source of the individual series coupled MOSFETs of transistors 14.

A functional description of transistor 11 illustrates how transistor 11 maintains operation at or near saturation. Transistor 12 is the only transistor that can be enabled under static or quiescent conditions. The size of transistor 12 is chosen so it will operate in or near saturation under quiescent conditions. If transistor 12 is disabled under quiescent conditions it is made equal in size to transistors 14. The combined enabling of transistor 12 and transistors 14 meets the maximum power requirements of the specific circuit application. Capacitor 24 disables drive transistors 14 under quiescent operating conditions thereby disabling transistors 13. Thus, transistor 11 appears as a reduced geometry transistor under quiescent conditions. The operating voltage range at base 16 ranges from millivolts to volts dependent on the circuit configuration in which transistor 11 is used. The processing technology to fabricate transistor 11 may also have an impact on the type of driver transistors available. Tight control over individual transistor threshold voltages provides a means for setting a predetermined voltage for enabling drive transistors 14. In the preferred embodiment depletion, neutral, or enhancement mode MOSFETs can be used for transistors 14. For example, assume transistors 22 and 23 are enhancement MOSFETs having predetermined threshold voltages. Transistor 23 has a higher threshold voltage than transistor 22. A bias circuit 29 provides a bias voltage that is applied to the gates of transistors 14. Bias circuit 29 comprises a current source 26 an enhancement MOSFET transistor 27, and a diode 28. Diode 28 can be formed from a transistor similar to transistors 13. The threshold voltage of transistor 27 is adjusted along with current source 26 to set the gate voltages of transistor 22 and 23 to be enabled at a corresponding predetermined voltage appearing at base 16. A positive voltage transition at base 16 will enable transistor 12 first, enable transistors 22 and 19 second, and transistors 23 and 21 third. Thus, transistors 13 and 14 are incrementally enabled corresponding to the voltage at base 16. The converse in turning off transistors 13 and 14 is also true as the voltage at base 16 changes from a positive transition to a negative transition.

Adjusting individual transistors to predetermined threshold voltages of transistors is not a practical solution for most integrated circuit process flows however. Alternate methods for setting enable or disable voltages for transistors 14 are available. Threshold voltages of like MOSFET devices in a standard semiconductor process flow are typically equal. In the preferred embodiment, transistors 14 are processed having equal threshold voltages which eliminates the need for special wafer processing steps. Bias circuit 29 generates a bias voltage providing a quiescent operating voltage at the gates of transistors 14. Different threshold voltages are created for transistors 14 by back biasing (differently) the source and bulk of the individual transistors which comprise transistors 14 (transistors 22 and 23). The bulk terminals for transistors 22 and 23 are indicated by terminals 31 and 32 respectively. Incremental enabling or disabling of transistors 14 is achieved by applying a different back bias voltage to each individual transistor (22, 23, etc.) of transistors 14. It is well known by those skilled in the art that a bulk effect or a back bias effect of a MOSFET transistor can produce an increase in threshold voltage. The voltage magnitude coupled to bulk terminal 31 or 32 adjusts the threshold of transistors 22 and 23 which determines when each transistor is enabled. A simple method for generating the voltages needed to couple to each bulk of each transistor 14 is to link the bulks together (possibly through resistive interconnect) and biasing the bulks as a resistor divider. Using bulk effect or back bias to adjust MOSFET threshold voltages simplifies device fabrication, provides a means for incrementally setting a large number of transistors to different threshold voltages, and allows for very small threshold voltage changes to be reliably produced between transistors.

A positive or negative voltage transition at base 16 is coupled through capacitor 24 to the gates of drive transistors 22 and 23. If capacitor 24 is significantly larger than any parasitic capacitance at the gates of transistors 22 and 23 the change in voltage at the gates of transistors 22 and 23 is approximately the change in voltage at base 16. In this example, assume that the voltage across diode 28 is approximately equal to the base-emitter voltage drop across transistors 19 and 21. Transistor 27 has its bulk and source at the same potential so no back bias or bulk effect is used. The bias voltage generated by transistor 27 and diode 28 is not enough to enable transistors 31 and 19 or transistors 23 and 21. Transistors 31 and 19 are enabled when a voltage change at base 16 increases the voltage at the gate of transistor 22 to overcome its increased threshold voltage due to the back bias voltage. Likewise, a further increase in voltage at base 16 enables transistor 23 when the voltage at the gate of transistor 23 overcomes its increased threshold voltage due to the back bias voltage. Any further drive transistors added to transistors 14 would have a larger threshold voltage than the preceding device by adjusting the back bias voltage of the transistor. Increasing the number of drive transistors provides further refinement to minimize the operating range of transistors 13 so each operates at or near maximum power efficiency (in or near saturation). During a negative transition at base 16, transistors 14 and corresponding transistors 13 are disabled in a sequence opposite from which they were turned on.

The individual drive transistors of transistors 14 do not have to be coupled serially. Equivalent results can be obtained by coupling the drain of each drive transistor to base 16. Coupling the drive transistors in this "parallel" fashion can minimize the impact of any voltage drop from drain to source of transistors 14 since the voltage drop is no longer additive. Increased capacitance at base 16 will result from this configuration.

In FIG. 1 transistor 11 is considered a bipolar transistor. If transistor 11 was a different type of transistor such as a MOSFET device or a Gallium arsenide device, similar benefits could be obtained using the incremental enabling or disabling method of transistor 11. Incremental enabling or disabling can produce a transistor size optimum for the input operating conditions and provide maximum power efficiency.

Figure 2:
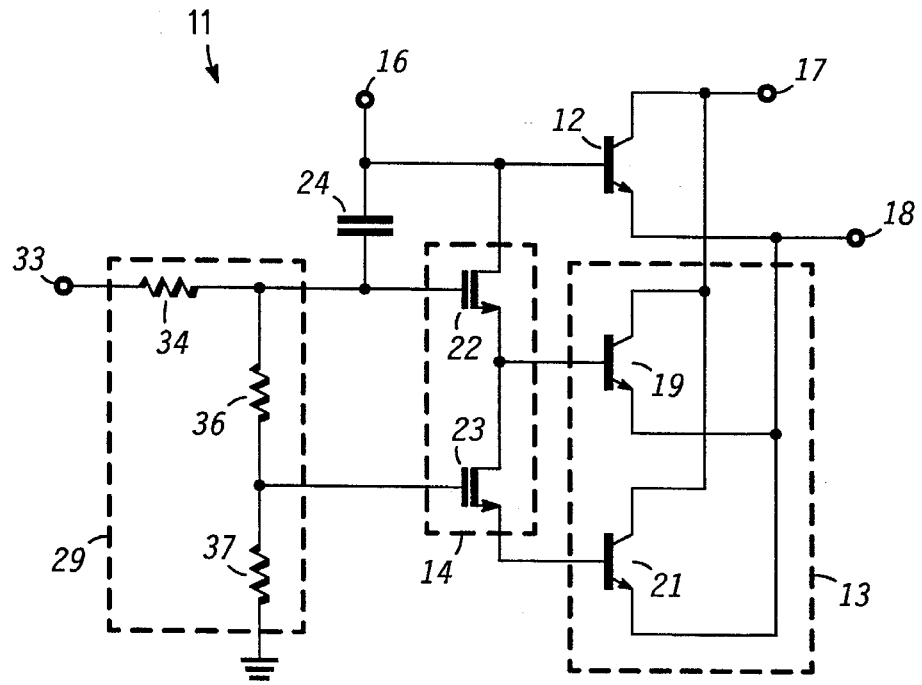
FIG. 2 is a schematic of an alternate embodiment of the power transistor of FIG. 1 in accordance with the present invention.

FIG. 2 is a schematic of an alternate embodiment of the power transistor of FIG. 1 in accordance with the present invention wherein like components thereof are designated with the same reference numbers.

Transistor 11 in FIG. 2 shows an alternate version of bias circuit 29 which generates incremental threshold voltages for enabling of transistors 14. Bias circuit 29 comprises a resistor divider network including resistors 34, 36, and 37 for providing a static bias voltage for each individual drive transistor of transistors 14. The resistor divider network also divides any voltage coupled through capacitor 24 from base 16. Drive transistor 23 which is the drive transistor farthest down the series chain receives the smallest voltage through the resistor divider thus a larger voltage at base 16 is required to enable transistors 23 and 21.

The resistor divider comprises a resistor 34, a resistor 36, and a resistor 37. Resistor 34 has a first terminal 33 coupled to a reference voltage for setting a quiescent bias voltage and a second terminal coupled to the gate of transistor 22. Resistor 36 has a first terminal coupled to the gate of transistor 22 and a second terminal coupled to the gate of transistor 23. Resistor 37 has a first terminal coupled the gate of transistor 23 and a second terminal coupled to ground. The last resistor in the resistor divider (shown coupled to ground) is typically tied to ground or a potential equal to or lower than the voltage at emitter 18. The magnitude of the voltage coupled to the first terminal 33 of resistor 34 and the resistor values of resistors 34, 36, and 37 determine the quiescent voltages at the gates of transistors 22 and 23. The values of capacitor 24, resistor 36, and resistor 37 determine how a voltage transient at base 16 is distributed to the gates of transistors 14. A series resistor must be included into the resistor divider with each additional transistor added to both transistors 14 and 13. Operation of transistor 11 is similar to that described in FIG. 1. By incrementally enabling or disabling transistors 13, transistor 11 can maintain operation in or near saturation.

Figure 3:
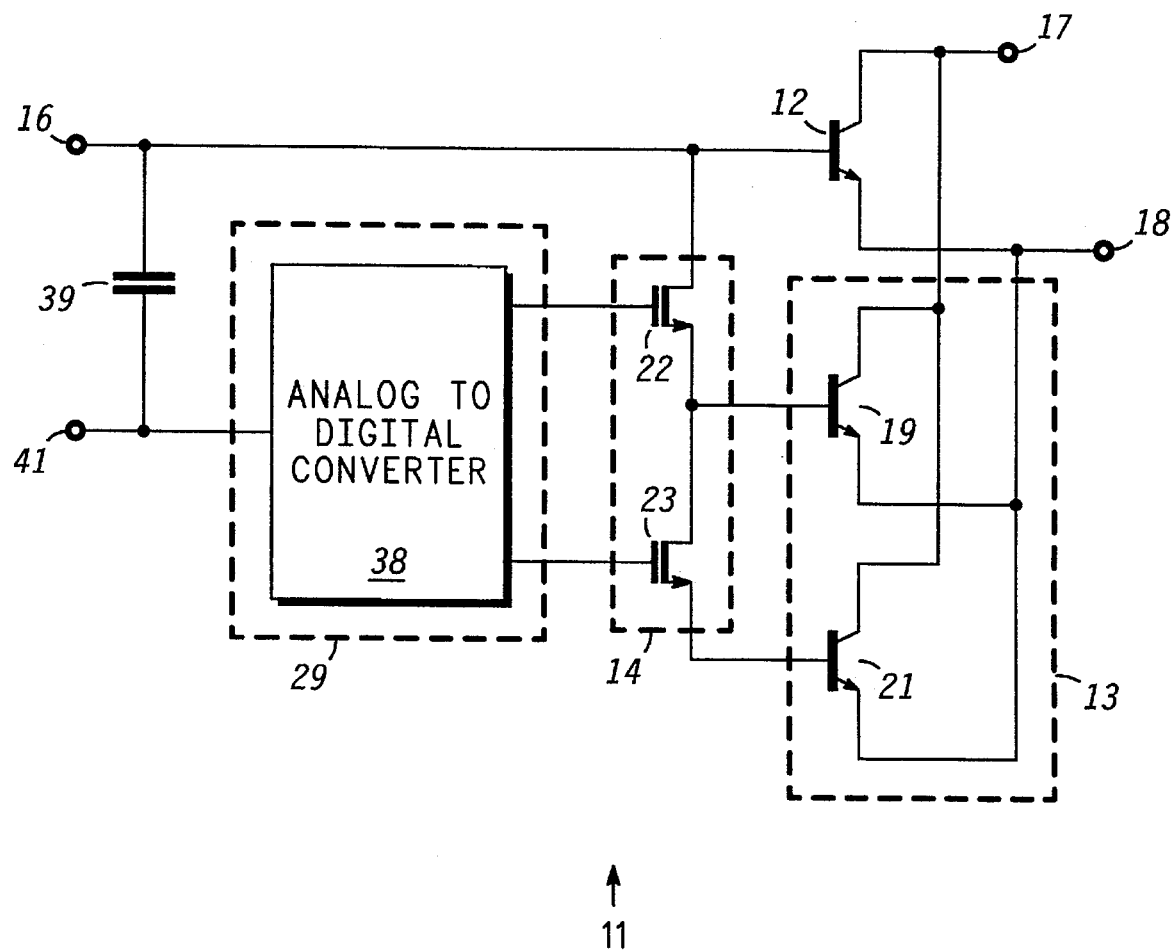
FIG. 3 is a schematic of an alternate embodiment of the power transistor of FIG. 1 in accordance with the present invention.

FIG. 3 is a schematic of yet another alternate embodiment of the power transistor of FIG. 1 in accordance with the present invention.

Transistor 11 in FIG. 3 shows an alternate version of bias circuit 29 which generates an incremental enabling of drive transistors 14 for low frequency operation. Capacitor 24 (FIG. 1) is removed. Bias circuit 29 comprises an analog to digital converter 38 having an input 41 coupled through a capacitor 39 to base 16, a first output coupled to the gate of transistor 22, and a second output coupled to the gate of transistor 23. A capacitor 39 couples an input 41 of the analog to digital converter to base 16. Input 41 is also coupled to a reference voltage for generating a bias voltage for the gates of transistors 14. Analog to digital converter 38 enables transistors 22 and 23 incrementally based on a voltage transition at base 16.

Operation of transistor 11 is similar to that described in FIG. 1. Transistors 14 and 13 are incrementally enabled by analog to digital converter 38 to maintain transistor 11 in or near saturation. The speed of transistor 11 is somewhat dependent on how fast analog to digital converter 38 can switch in drive transistors 14.

By now it should be appreciated that a power efficient transistor has been provided. A power efficient transistor operates in or near saturation. By incrementally enabling or disabling transistors which comprise transistor 11 in response to the voltage at the base it is possible to minimize transistor power dissipation.

We claim:

1. A power efficient transistor having a base, a collector, and an emitter comprising:

a first transistor having a base, collector, and emitter coupled respectively to the base, collector and emitter of the power efficient transistor;

a plurality of transistors for increasing the current handling capability of the power efficient transistor, each transistor of said plurality of transistors having a base, collector coupled to the collector of the power efficient transistor and an emitter coupled to the emitter of the power efficient transistor; and driving means coupled to each base of said plurality of transistors, said driving means being responsive to a signal applied to the base of the power efficient transistor for incrementally enabling and disabling said plurality transistors to maintain the power efficient transistor in or near saturation.

2. The power efficient transistor of claim 1 wherein said first transistor and each transistor of said plurality of transistors are substantially equal in size.

3. The power efficient transistor of claim 1 wherein said driving means is capacitively coupled to the base of the power efficient transistor.

4. The power efficient transistor of claim 1 wherein said driving means comprises a plurality of drive transistors, each drive transistor enabling a corresponding one of each transistor of said plurality of transistors.

5. The power efficient transistor of claim 4 wherein said plurality of drive transistors are serially coupled.

6. The power efficient transistor of claim 4 wherein each drive transistor of said plurality of drive transistors is a MOSFET and wherein said plurality of drive transistors have different threshold voltages from one another.

7. The power efficient transistor of claim 6 wherein said drive transistors have bulks isolated from one another and wherein a different voltage is applied to each bulk for generating different backbias voltages in each drive transistor such that each driver transistor has a different threshold voltage.

8. The power efficient transistor of claim 4 further including a resistor divider network for incrementally enabling and disabling said plurality of drive transistors.

9. The power efficient transistor of claim 4 further including an analog to digital converter for incrementally enabling and disabling said plurality of drive transistors.

10. A method for operating a power transistor comprising at least two transistors in a power efficient manner, the method comprising incrementally enabling or disabling transistors of the power transistor to maintain the power transistor in or near saturation.

11. An integrated power transistor having a base, a collector, and an emitter comprising:

a first transistor having a base, a collector, and an emitter coupled to the base, collector, and emitter, respectively, of the integrated power transistor;

a plurality of transistors for increasing the current handling capability of the integrated power transistor, each transistor of said plurality of transistors having a base, a collector coupled to the collector of the integrated power transistor and an emitter coupled to the emitter of the integrated power transistor; and a plurality of drive transistors for providing a drive to a corresponding transistor of said plurality of transistors, each drive transistor including a gate, a drain being coupled for receiving a voltage, a source coupled to a base of said corresponding transistor, and a bulk, said bulk of each drive transistor being isolated from one another, said gates of said plurality of drive transistors being coupled in common to said base of said first transistor, and said bulk of each drive transistor being coupled to a different voltage for creating a different back bias voltage in each drive transistor thereby generating a different threshold voltage in each drive transistor.

12. The integrated power transistor of claim 11 wherein said first transistor and said plurality of transistors are substantially equal in size.

13. The integrated power transistor of claim 11 wherein said first transistor includes a conductive area that maintains said first transistor in or near saturation under quiescent conditions.

14. The integrated power transistor of claim 11 wherein said gates of said plurality of drive transistors are capacitively coupled to the base of the integrated power transistor.

15. The integrated power transistor of claim 14 further including a bias circuit for providing a bias voltage to said gates of said plurality of drive transistors.

16. The integrated power transistor of claim 11 wherein said plurality of drive transistors are serially coupled.

17. The integrated power transistor of claim 11 wherein the drains of the plurality of drive transistors are coupled to the base of the integrated power transistor.

* * * * *

UNITED STATES PATENT AND TRADEMARK OFFICE
CERTIFICATE OF CORRECTION

PATENT NO. : 5,546,040
DATED : August 13, 1996
INVENTOR(S) : Scott D. McCall et al.

It is certified that error appears in the above-indentified patent and that said Letters Patent is hereby corrected as shown below:

In claim 1, column 6, line 5, insert --,-- between "collector and".
In claim 1, column 6, line 10, (first occurrence) insert --a-- in front of "collector".

In claim 11, column 6, line 65, delete "a" after "providing".

Signed and Sealed this

Fifteenth Day of April, 1997

Attest:

BRUCE LEHMAN

Attesting Officer

Commissioner of Patents and Trademarks